(12) United States Patent
Kameda et al.

(10) Patent No.: US 6,517,924 B1
(45) Date of Patent: Feb. 11, 2003

(54) LAMINATED BODY AND METHOD FOR PRODUCING THE SAME

(75) Inventors: Hirokazu Kameda, Kusatsu; Shuya Nakao, Yokaichi; Kenji Tanaka, Shiga-ken, all of (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 09/300,948

(22) Filed: Apr. 28, 1999

(30) Foreign Application Priority Data

Apr. 28, 1998 (JP) .......................... 10-118229
Apr. 5, 1999 (JP) .......................... 11-097155

(51) Int. Cl.$^7$ .......................... C04B 35/00; H01L 21/48
(52) U.S. Cl. .......................... 428/138; 428/901; 428/702; 428/701; 428/699; 428/698; 428/428; 428/426; 428/210; 428/209; 264/614; 264/673; 264/672; 174/258; 174/259; 156/89.12
(58) Field of Search .......................... 428/139, 901, 428/702, 701, 699, 698, 428, 426, 210, 209; 156/89.12; 264/614, 673, 672; 174/258, 259

(56) References Cited

U.S. PATENT DOCUMENTS 5,102,720 A * 4/1992 Raj .......................... 421/209
5,102,730 A    4/1992 Raj .......................... 421/209
5,254,191 A * 10/1993 Mikeska et al. .......................... 156/89
5,264,399 A * 11/1993 Casey et al. .......................... 501/32
5,855,711 A *  1/1999 Araki et al. .......................... 156/89.16

FOREIGN PATENT DOCUMENTS

| EP | 0479219 A1 | 10/1991 |
| EP | 0535711 A2 | 10/1992 |
| EP | 0591733 A1 | 9/1993 |
| JP | 5-102666 | * 4/1993 |
| JP | 6-329476 | * 11/1994 |
| JP | 7-330445 | * 12/1995 |
| WO | 91/10630 | 7/1991 |

* cited by examiner

Primary Examiner—William P. Watkins, III
(74) Attorney, Agent, or Firm—Dickstein, Shapiro, Morin & Oshinsky, LLP.

(57) ABSTRACT

The present invention provides a laminated body, comprising: a first sheet layer comprising an aggregate of a first powder, at least a part of the first powder being in a sintered state; a second sheet layer disposed so as to make contact with the first sheet layer and comprising an aggregate of a second powder, the second powder being in a non-sintered state; and the first powder and the second powder being solidified to each other by allowing a part of the first sheet layer material to diffuse or to flow into the second sheet layer.

24 Claims, 7 Drawing Sheets

LAMINATED BODY AND METHOD FOR PRODUCING THE SAME

BACKGROUND OF THE INVENTION

1. Field of the Invention

The present invention relates to a laminated body and a method for producing the same. More particularly, the present invention relates to a laminated body in which a part of the layers are in a sintered state and the contraction thereof due to baking is suppressed, and a method for producing the same.

2. Description of the Related Art

In compliance with the recent trend of making chip components compact and lightweight, circuit boards for packaging these components are also required to be compact and lightweight. A glass-ceramic multilayer circuit board is effective for responding to the requirements described above because a highly integrated wiring is made possible with the glass-ceramic multilayer circuit board while making the board thin. However, such glass-ceramic multilayer circuit boards are produced through a baking step and usually accompanied by contraction during the sintering process so that a dimensional distribution of, for example, about ±0.5% is inevitable using the currently available technology. Such dimensional distribution becomes more evident in a glass-ceramic multilayer board having a cavity for housing appropriate electronic components.

Japanese Unexamined Patent Publication No. 5-102666 or Japanese Unexamined Patent Publication No. 7-330445 proposes, for example, a method for producing a glass-ceramic multilayer circuit board with a high dimensional precision, and Japanese Unexamined Patent Publication No. 6-329476 proposes, for example, a method for producing a glass-ceramic multilayer circuit board having a cavity, wherein green sheets which are not sintered at the sintering temperature of a glass-ceramic molded body are laminated on one side or on both sides of the glass-ceramic molded body and, after baking the green sheet in the laminated state, powder layers originating from such green sheet are removed.

However, according to the method for producing the glass-ceramic multilayer circuit board as described above, a complicated process is required for removing the powder layers originating from the green sheet after baking, and it becomes impossible to previously form a conductive layer on the surface of the glass-ceramic molded body before baking in order to bake the conductive layer simultaneously with the glass-ceramic molded body. Another problem is that surface roughness of the glass-ceramic multilayer circuit board after removing the powder layer originating from the green sheet becomes large.

Japanese Unexamined Patent Publication No. 9-266363 discloses a method comprising the step of sintering merely the glass-ceramic layer by baking the glass-ceramic layer in a laminated state with an alumina layer, allowing the glass component contained in the glass-ceramic layer to permeate into the alumina layer while the alumina layer remains to be non-sintered state, thereby allowing the alumina layer to be solidified. In this case, the glass permeating from the glass-ceramic layer is never distributed throughout the entire area of the alumina layer, but instead the surface is polished simultaneously with removing the non-solidified portion of the alumina layer and a conductive film for the circuit pattern is formed after the foregoing removing and polishing steps.

Accordingly, while it is possible to diminish surface roughness by the removing and polishing steps according to the conventional art, an independent removing step after the baking step as in the foregoing conventional art is also required, making it impossible to obtain the conductive film to be formed on the surface of the circuit board by baking the film simultaneously with the glass-ceramic layer.

Japanese Unexamined Patent Publication No. 5-136572 discloses a method, as in the foregoing conventional art, comprising the step of laminating green sheets that are not sintered at the baking temperature of the glass-ceramic on one face or on both faces of the glass-ceramic molded body, followed by sintering merely the glass-ceramic molded body. In this method, the powder layer originating from the non-sintered green sheet is filled with a resin.

According to the conventional arts, a separate step of filling the resin is required, although the step of removing the non-sintered powder layer has been excluded.

SUMMARY OF THE INVENTION

Accordingly, the object of the present invention is to provide a laminated body that does not especially require post-treatment steps such as a removing step and resin filling step after the baking step to attain a state that can be offered for use, and a method for producing the same.

One preferred embodiment of the present invention provides a laminated body, comprising:

- a first sheet layer comprising an aggregate of a first powder, at least a part of the first powder being in a sintered state;
- a second sheet layer disposed so as to make a contact with the first sheet layer and comprising an aggregate of a second powder, the second powder being in a non-sintered state; and
- the first powder and the second powder being solidified to each other by allowing a part of the first sheet layer material to diffuse or to flow into the second sheet layer.

In the above described laminated body, the part of the first sheet layer material may diffuse or flow into the entire area of the second sheet layer and the overall second powder is solidified with the first sheet layer material.

In the above described laminated body, at least a part of the first powder may have a melting point lower than the sintering temperature of the second powder.

In the above described laminated body, the aggregate of the first powder may contain a glass material.

In the above described laminated body, the glass material may comprise a material made to be a glassy state by melting through baking.

In the above described laminated body, the glass material may comprise a nucleated glass material.

In the above described laminated body, the aggregate of the first powder may further comprise a ceramic material.

In the above described laminated body, the aggregate of the first powder may comprise a mixed material comprising at least one of anorthite nucleated glass, borosilicate glass and corgelite system nucleated glass and alumina.

In the above described laminated body, the aggregate of the second powder may comprise a ceramic material.

In the above described laminated body, a plurality of the first sheet layers may be laminated via the second sheet layer.

In the above described laminated body, a pair of the first sheet layers respectively positioned at each side of the second sheet layer may have substantially the same thickness with each other.

In the above described laminated body, a plurality of the second sheet layers may be laminated via the first sheet layer.

In the above described laminated body, a conductive film may be provided on the surface and/or inside of the laminated body, so that thereby the first sheet layers, the second sheet layers and the conductive film constitute a circuit board.

In the above described laminated body, the second sheet layer may be thinner than the first sheet layer.

In the above described laminated body, a cavity may be provided so as to allow its opening to be positioned along at least one of the principal faces of the laminated body.

Another preferred embodiment of the present invention further provides a method for producing a laminated body comprising the steps of:

a first step for preparing a raw laminated body provided with a first sheet layer being in a raw state comprising a first powder and a second sheet layer being in a raw state disposed so as to make contact with the first sheet layer and comprising a second powder not sintered at a temperature capable of sintering at least a part of the first powder; and a second step for baking the raw laminated body at a predetermined temperature so as to allow at least a part of the first powder to be sintered and the second powder to be not sintered, along with solidifying the first sheet layer and the second sheet layer to each other by allowing a part of the first sheet layer material to diffuse or to flow into the second sheet layer.

In the above described method, the raw laminated body may comprise a plurality of the first sheet layers laminated via the second sheet layer, and a pair of the first sheet layers respectively positioned at each side of the second sheet layer may have substantially the same thickness with each other.

In the above described method, the first sheet layer may be prepared as a first green sheet comprising the first powder in the first step.

In the above described method, the second sheet layer may be prepared as a second green sheet comprising the second powder in the first step, the first step including a step for laminating the second green sheet so as to make contact with the first green sheet.

In the above described method, a sheet composition obtained by forming the second sheet layer on the first green sheet may be prepared in the first step, at least a part of the raw laminated body comprising the sheet composition.

In the above described method, the first sheet layer may comprise a portion obtained by laminating a plurality of the first green sheets so as to make contact with each other at least a part of the first sheet layer in the first step.

In the above described method, a part of the first sheet layer may diffuse or flow into the entire area of the second sheet layer to solidify the overall second powder in the second step.

In the above described method, the first step may include a step for forming the conductive film on the surface and/or inside of the raw laminated body.

In the above described method, the conductive film may contain a conductive metal powder that is sintered in the second step.

In the above described method, the second sheet layer may be thinner than the first sheet layer in the raw laminated body.

In the above described method, the first step may include a step for forming a cavity so as to allow its opening to be positioned along at least one of the principal faces of the raw laminated body.

In the above described method, the first step may include a step for laminating a plurality of the green sheets to obtain the raw laminated body, and the step for forming the cavity may include a step for disposing a penetrating hole through a specified green sheet positioned at outside among the plural green sheets.

In the above described method, the step for providing the penetrating hole may be executed prior to the step for laminating a plurality of the green sheets.

In the above described method, the lamination step may include a pre-lamination step for obtaining a pre-laminating body by previously laminating the layers to be provided with the penetrating hole among the plural green sheets to be laminated, and the step for providing the penetrating hole may include the step for providing a penetrating hole through the pre-laminating body.

As described above, the present invention provides a laminated body provided with first sheet layers and second sheet layers disposed to make contact with the first sheet layers, wherein at least a part of a first powder contained in the first sheet layer is in a sintered state while a second powder contained in the second sheet layer is in a non-sintered state. However, the laminated body itself can be offered for use without removing the second sheet layer after processing or without applying any treatment for filling the composition with a resin because the second sheet layer is solidified by allowing a part of the first sheet layer to diffuse or flow into the second sheet layer.

Excluding the need of removing the second sheet layer or filling the resin thereto makes it possible to bake a conductive film formed on the surface simultaneously with baking of the first sheet layer.

Making the particle size of the powder to be contained in the sheet layer positioned on the surface of the laminated body small allows a laminated body with a small surface roughness to be obtained.

Since powders having desired properties such as insulating property, dielectric property, piezoelectric property and magnetic property may be relatively freely used for the second powder contained in the second sheet layer, the laminated body obtained can be easily endowed with specified electromagnetic functions. Production of substrate such as a L-C-R composite substrate may be made easy by an arbitrary combination of these properties. When powders having a high abrasion resistance and high tenacity are used for the second powder, mechanical strength of the laminated body can be enhanced. Otherwise, when powders having light reflection property or infrared light reflection property are used for the second powder, the laminated body can be endowed with a specified optical function.

When the first powder for forming the first sheet layer contains an anorthite nucleated glass powder, such anorthite nucleated glass is easily diffused or flowed into the entire region of the second sheet layer, allowing the overall second powder to be sufficiently solidified with the first powder.

Likewise, when the second sheet layer is thinner than the first sheet layer, a part of the material of the first sheet layer is easy to diffuse or flow into the entire region of the second sheet layer, thereby making it easy to sufficiently solidify the overall second powder with the first sheet layer material.

According to the method for producing the laminated body of the present invention, the second powder is especially not sintered in the sintering step, so that the second sheet layer containing this second powder functions so as to suppress contraction of the first sheet layer along the major surface thereof, thereby suppressing contraction of the overall laminated body along the major surface of the first sheet layer due to baking to reduce the dimensional distribution of the laminated body obtained.

Since dimensional distribution is especially liable to occur in a laminated body having a cavity, the present invention can be more advantageously applied to the laminated body having a cavity and the method for producing the same, reducing distortion at the cavity portion when the present invention is applied to the laminated body having a cavity.

When the raw laminated body prepared in the method for producing the laminated body according to the present invention is provided with a pluality of the first sheet layers laminated via the second sheet layer, the degree of contraction of respective first sheet layers in the baking step can be made to be substantially the same with each other provided that the thicknesses of the first sheet layers positioned at each side of the second sheet layer is adjusted to be substantially the same with each other, advantageously suppressing warp in the laminated body after baking.

Other features and advantages of the present invention will become apparent from the following description of the invention which refers to the accompanying drawings.

DESCRIPTION OF THE PREFERRED EMBODIMENTS

Figure 1:
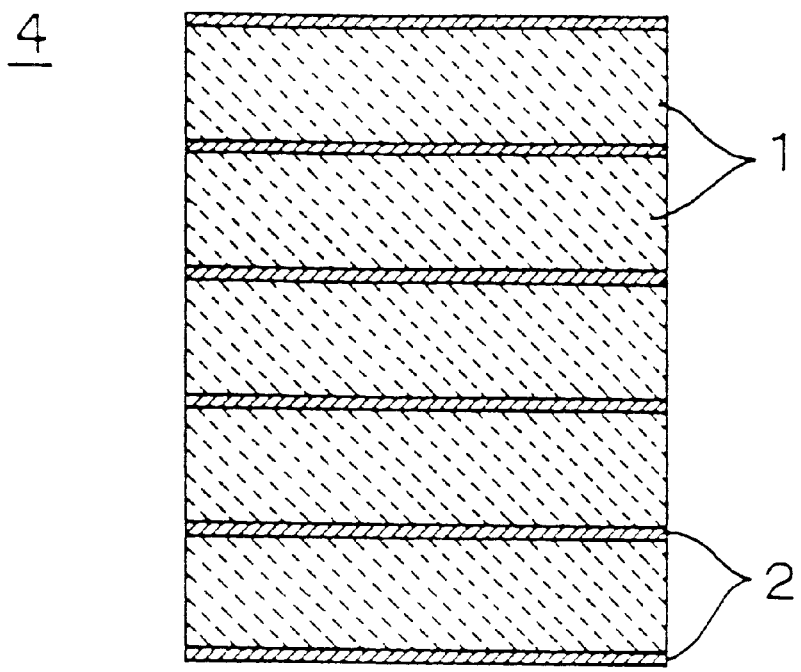
FIG. 1 denotes a cross section illustrating the laminated body 4 according to the first preferred embodiment of the present invention.
Figure 2:
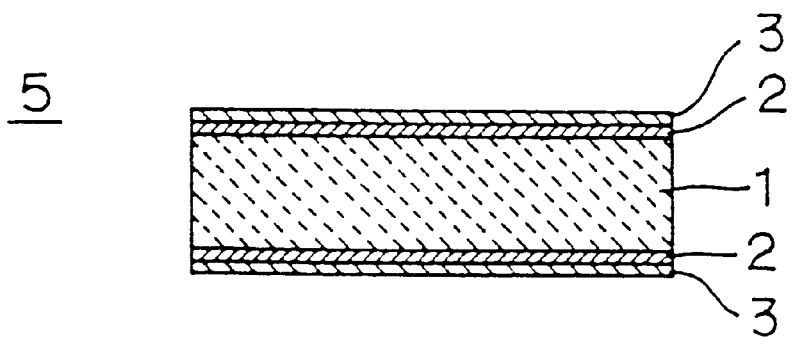
FIG. 2 denotes a cross section illustrating the laminated body 5 according to the second preferred embodiment of the present invention.
Figure 3:
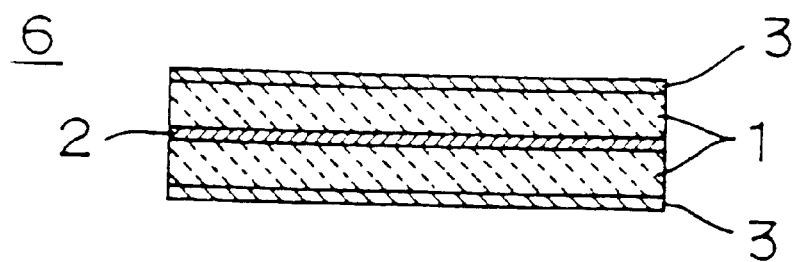
FIG. 3 denotes a cross section illustrating the laminated body 6 according to the third. preferred embodiment of the present invention.
Figure 4:
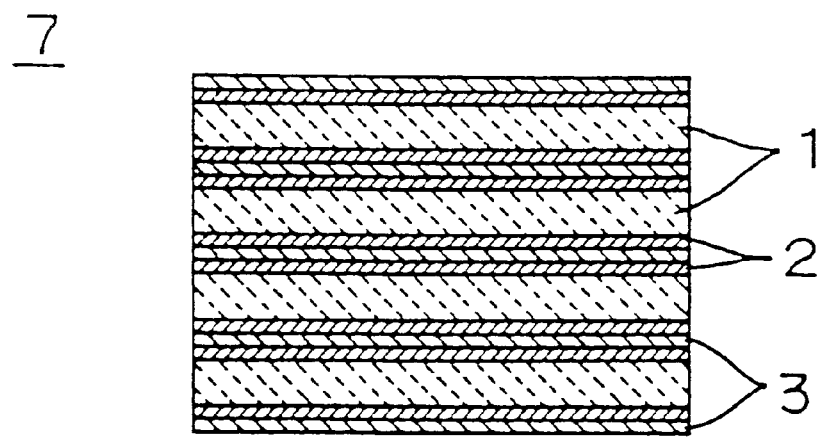
FIG. 4 denotes a cross section illustrating the laminated body 7 according to the fourth preferred embodiment of the present invention.

While a variety of embodiments may be conceived with respect to the laminated structures of the laminated body according to the present invention, four typical preferred embodiments will be described hereinafter referring to FIG. 1 through FIG. 4 Respective preferred embodiments shown in FIG. 1 to FIG. 4 are commonly provided with first sheet layers 1 containing an aggregate of the first powder and second sheet layers 2 containing an aggregate of the second powder, while respective preferred embodiments shown in FIG. 2 to FIG. 4 are commonly provided with conductive films 3. Accordingly, the common elements from FIG. 1 through FIG. 4 are given common reference numerals which are collectively described hereinafter.

The laminated body 4 shown in FIG. 1 according to the first preferred embodiment is provided with the first sheet layers 1 composed of a plurality of laminated layers as well as the second sheet layers 2 that are formed by laminating a plurality of layers so as to make contact with both faces on each of the first sheet layer, or formed on surface layers and inside of the laminated body 4.

The laminated body 5 shown in FIG. 2 according to the second preferred embodiment is provided with the first sheet layers 1 as well as the second sheet layers 2 formed on both faces of the first sheet layer 1 so as to make contact with the first sheet layer 1. The conductive film 3 is formed, for example, by printing a paste containing a conductive metal powder with a desired patterning, if necessary.

The laminated body 6 shown in FIG. 3 according to the third preferred embodiment is provided with the first sheet layers 1 formed of a plurality of laminated layers as well as the second sheet layers 2 elongating along the interface between the two first sheet layers 1 so as to make contact with the first sheet layers 1, or formed within the laminated body 6. The conductive films 3 are formed on the surfaces of the laminated body 6 with a desired pattern.

The laminated body 7 shown in FIG. 4 according to the fourth preferred embodiment is provided with the first sheet layers 1 formed of a plurality of laminated layers as well as the second sheet layers 2 formed of a plurality of laminated layers on the surfaces and inside of the laminated body 7 formed so as to make contact with the first sheet layers. The conductive films 3 are formed on the surfaces and inside of the laminated body 7 with a desired pattern. In more detail, the conductive films 3 are formed on the second sheet layers 2 on the surfaces of the laminated body 7 and are inserted between the two second sheet layers 2 inside of the laminated body 7.

The second sheet layer 2 is made thinner than the first sheet layer 1 in each embodiment described above.

Among the foregoing embodiments, the laminated bodies 5, 6 and 7 shown in FIG. 2, FIG. 3 and FIG. 4, respectively, in which the conductive films 3 are formed are by themselves suitable for use as circuit boards.

The first sheet layers 1 shown in FIG. 1 to FIG. 4 contain an aggregate of the first powder. The second sheet layers 2 are disposed so as to make contact with the first sheet layers 1 and contain an aggregate of the second powder. Of these first and second powders, a part of the first powder is in a sintered state and the second powder is in a non-sintered state but it is solidified by allowing a part of the material in the first sheet layers 1 to diffuse or to flow into the second sheet layers 2.

A raw laminated body provided with the first sheet layers 1 containing the first powder and being in a raw state, and the second sheet layers disposed so as to make contact with the first sheet layers 1 and containing the second powder that is not sintered at a temperature capable of sintering at least a part of the first powder, is firstly prepared in order to obtain the laminated bodies 4 to 7 provided with such first and second sheet layers 1 and 2. At least a part of the first powder is sintered by baking these raw laminated bodies at a predetermined temperature along with solidifying the second powder without sintering by allowing a part of the material in the first sheet layer 1 to diffuse or to flow into the second sheet layer 2. The laminated body itself thus obtained may be offered for use as circuit boards or as substrates for the circuit boards.

In the laminated body 5 to 7 provided with the conductive film 3 as shown in FIG. 2 to FIG. 4, respectively, such conductive film 3 has been already formed on the surface and/or inside of the laminated body when the raw laminated body is prepared. When the conductive film 3 is formed of a paste containing the conductive metal powder, it can be sintered in the step for sintering the raw laminated body.

While a part of the material of the first sheet layers 1 is diffused or flowed into the overall area of the second sheet layer 2 in the laminated bodies 4 to 7, it is preferable that the overall second powder is solidified with the first sheet layer material. The second sheet layer 2 is preferably adjusted to be thinner than the first sheet layer 1 in order to secure such solidified state.

It is also preferable that at least a part of the first powder has a melting point lower than the sintering temperature of the second powder in order to allow merely a part of the first powder to be in a sintered state and in order to more readily solidify the second powder by allowing a part of the material in the first sheet layers 1 to diffuse or flow into the second sheet layer 2.

The first powder containing a glass material is advantageously used for the first sheet layer 1. The glass material may contain a material that has turned into a glassy state by baking. The nucleated glass is more advantageously used for the glass material. The first powder may contain a powder comprising a glass material and a powder comprising a ceramic material.

An anorthite nucleated glass powder and alumina powder are used for the first powder to be contained in the first sheet layer 1 before baking in a specified more preferable embodiment. Consequently, the aggregate of the first powder to be in the first sheet layer 1 after baking is prepared to contain a mixed material of the anorthite nucleated glass and alumina.

A part of the anorthite nucleated glass as a glass material as described above may be substituted with other glass materials such as borosilicate glass or corgelite system nucleated glass. However, the anorthite nucleated glass is especially preferable since it can be melted during baking step to sufficiently diffuse or flow into the second sheet layer 2.

Water, toluene or xylene can be used for the dispersion medium of the powder for forming the raw first sheet layer 1. An appropriate amount of a binder may be added in addition to the dispensing agent, substances such as a butyral resin, acrylic resin, urethane resin, vinyl acetate resin and polyvinyl alcohol being available as the binder. It is also preferable to appropriately add a plasticizer, a dispersing agent and an anti-foaming agent, if necessary.

In a more specified embodiment, a slurry is obtained by mixing the anorthite nucleated glass powder with a particle size of about 5 $\mu$m and the alumina powder with a particle size of about 0.5 $\mu$m in a weight ratio of about 90:10 followed by further mixing with water as a dispersing agent and a urethane resin as a binder. After removing air bubbles from the slurry, a sheet is formed by the doctor blade method to obtain a raw first sheet layer 1 after drying. A extrusion molding method, roll molding method and powder press molding method may be used as the method for molding the first sheet layer 1 instead of the doctor blade method described above.

The thickness of the raw sheet is 650 $\mu$m in the first sheet layer 1 for the laminated body 4 and 5 shown in FIG. 1 and FIG. 2, respectively, while the thickness of the raw sheet is 250 $\mu$m in the first sheet layer 1 for the laminated body 6 and 7 shown in FIG. 3 and FIG. 4, respectively.

Figure 6:
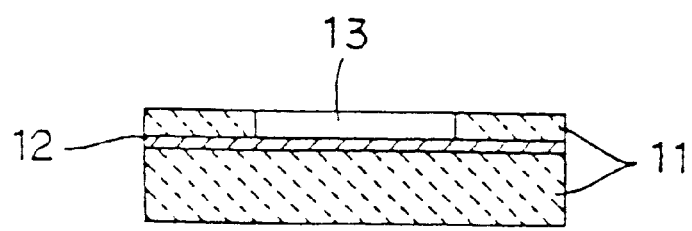
FIG. 6 denotes a cross section illustrating the raw laminated body in the sample 2 produced in the experimental example similar to the sample 1 shown in FIG. 5.
Figure 7:
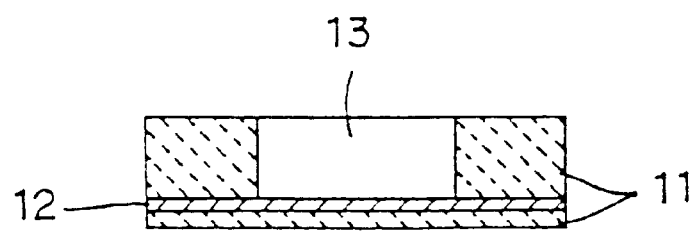
FIG. 7 denotes a cross section illustrating the raw laminated body in the sample 3 produced in the experimental example similar to the sample 1 shown in FIG. 5.

With respect to the thickness of the first sheet layer 1, it is preferable that the first sheet layers 1 be positioned at each side of the second sheet layer 2 substantially have the same thickness with each other when a plurality of the first sheet layers 1 are laminated via the second sheet layer 2 as seen in the laminated bodies 4, 6 and 7 shown in FIG. 4, FIG. 6 and FIG. 7, respectively. When the thickness of each first sheet layer 1 is determined with the relationship described above, the contraction ratio of each first sheet layer 1 in the baking step can be adjusted to be substantially the same with each other, thereby allowing generation of warp in the laminated bodies 4, 6 and 7 after baking to be advantageously suppressed.

With respect to the mixing ratio of the anorthite nucleated glass and alumina described above, the ratio of alumina may be reduced to less than about 10% by weight or increased to more than 10% by weight, e.g., up to about 50% by weight. Particle sizes other than those described above can be used.

Usually, the green sheet to be formed into the raw first sheet layer 1 is at first prepared for obtaining the raw laminated body, the second sheet layer 2 being formed so as to make contact with this green sheet.

A ceramic powder is advantageously used for the second powder for forming the second sheet layer 2. In a more practical embodiment, an alumina powder is used. A slurry of alumina with a solid fraction concentration of about 10 to 50% by weight is prepared using this alumina powder, in which the green sheet to be formed into the first sheet layer 1 produced as described above is dipped to form the second sheet layers 2 on one face or on both faces of the green sheet after drying. The thickness of the second sheet layer 2 in its raw state is adjusted, for example, to about 5 to 50 $\mu$m.

Examples of the second powder to be contained in the second sheet layer 2 include MgO, $ZrO_2$, $SiO_2$, $TiO_2$, $BaTiO_3$, $SrTiO_3$, $MgTiO_3$, $PB(Zr, Ti)O_3$, $B_4C$, SiC and WC, besides the foregoing alumina powder, a material having good wettability to the first powder being preferably selected.

A spray method, roll coating method, thin-film forming method, sheet transcription method (hot stump method) and sheet-press method may be used instead of the foregoing dip method for forming the raw laminated body in the method for forming the second sheet layer 2 so as to make contact with the green sheet to be formed into the first sheet layer 1.

The conductive film 3 is screen-printed using, for example, an Ag paste. An Ag—Pd paste, Ag—Pt paste, Cu paste and Ni paste may also be used.

Raw laminated bodies for respective laminated bodies 4 to 7 can be obtained by forming the first and second sheet layers 1 and 2 in a raw state, and the conductive film 3 if necessary, followed by laminating in a desired configuration. Respective elements constituting the laminated body can be densely solidified by applying a pressure of about 100 kg/cm$^2$ with a press machine along with compacting each element in these raw laminated bodies. Then, these raw laminated bodies are baked in the air at about 700 to 1000° C., at about 850° C. for example, for 2 hours.

At least a part of the first powder contained in the first layer 1 is sintered in this baking step but the second powder contained in the second sheet layer 2 is not sintered, the second sheet layer 2 suppressing contraction of the first sheet layer 1 along the face direction. Experimental results showed that the contraction ratios for respective laminated bodies 4 to 7 could be suppressed to less than about 0.5%.

A part of the material of the first sheet layers 1, for example a part of the anorthite nucleated glass, disperses or flows into the second sheet layer 2 in this baking step, and thereby the second powder is solidified. When such anorthite nucleated glass powder is especially used for the first powder for the first sheet layer 1, the powder easily diffuses or flows into the entire area of the second sheet layer 2, thereby allowing the overall second powder to be sufficiently solidified.

According to experiments, the surface roughness Ra of the laminated bodies 4 to 7 thus obtained showed a satisfactory value of about 0.2 μm.

The laminated bodies 4 to 7 themselves after completing the foregoing baking step may be used without any treatments such as removing the second sheet layer 2.

For the purpose of confirming that the laminated bodies themselves are possible to be used as they are, a permeation test (red check) was carried out. At first, the laminated bodies 4 to 7 were dipped into a red-colored solvent. Then, the laminated bodies 4 to 7 were taken out of the solvent and washed with water. After drying, the laminated bodies 4 to 7 were visually observed to confirm if the red-colored solvent remains on the surface. The results indicated that no red-colored solvent remains on each of the laminated bodies 4 to 7, showing that the surface of the second sheet layer 2 are not porous but sufficiently compact and smooth, being impossible for the solvent to penetrate into the interior of the body.

While the green sheet to be formed into the raw first sheet layer 1 is firstly prepared in order to obtain the raw laminated body followed by forming the second sheet layer 2 so as to make contact with this green sheet in the foregoing description, a variety of procedures as described below can be adopted for obtaining such green sheet.

For example, the first green sheet containing the first powder to be formed into the first sheet layer 1 is prepared along with preparing the second green sheet containing the second powder to be formed into the second sheet layer 2, the raw laminated body being obtained by laminating the first green sheets and second green sheets in a desired order.

Alternatively, a method for obtaining the raw laminated body may be adopted using a sheet composition for yielding the first and second sheet layers 1 and 2 produced by forming the second sheet layer 2 on the first green sheet prepared by allowing the first green sheet to contain the first powder to be formed into the first sheet layer 1.

When one desires to obtain a relatively thick first sheet layer 1, a plurality of the first green sheets may be laminated so as to make contact with each other, the second green sheet being laminated at a desired site or the sheet composition described above being laminated at a desired site for forming the second sheet layer 2.

The present invention can be advantageously applied for the laminated body provided with a cavity, the opening of which is positioned along the principal faces of the composition.

When one desires to produce a laminated body in which a cavity is formed, the cavity is usually formed immediately after the raw laminated body is produced. More practically, when a plurality of the green sheets, or a plurality of green sheets including the sheet composition are to be laminated, a penetration hole is provided on a specified green sheet positioned at the outside of the plural green sheets by punching to form a desired cavity.

The step for providing the penetrating hole on the green sheet is usually executed prior to the step for laminating the plural green sheets. However, when one desires to obtain a pre-laminating body by previously laminating the green sheets to be provided with a penetrating hole among the plural green sheets to be laminated, the penetrating hole is formed on the prelaminating body before subjecting the pre-laminating body provided with the penetrating hole to the final lamination step.

The results of experiments carried out for evaluating warp characteristics of the laminated body provided with the cavity as described above will be described hereinafter.

A $SiO_2$—CaO—$Al_2O_3$—Mgo—$B_2$—$O_3$ glass powder with a particle size of 5 μm and an alumina powder with a particle size of 0.5 μm were prepared as the first powders. These powders were mixed to be a composition comprising 60 parts by weight of the former and 40 parts by weight of the latter. Added and mixed were 40 parts by weight of water and 1 part by weight of polyoxyethylene nonylphenyl ether as a dispersing agent, and 5 parts by weight of a polyurethane resin as a binder, obtaining a slurry containing the first powders by mixing and dispersion treatment.

After removing air bubbles from the slurry, a sheet was formed by applying a doctor blade method, obtaining plural green sheets to be formed into the first sheet layer with a thickness of 180 μm by drying.

In a separate run, an alumina powder with a particle size of 0.5 μm was prepared as a second powder. A solvent prepared by mixing terpine oil and ethyl cellulose in a volume ratio of 92:8 was added to 50 parts by weight of the alumina powder followed by mixing and dispersing, thus obtaining a paste containing the second powder.

The paste was coated on the principal face of a specified green sheet among these green sheets described above to form a paste layer with a thickness of 10 μm to be formed into the second sheet layer, thus obtaining a sheet composition.

Then, penetrating holes having a 35 mm square cross section were formed in order to provide cavities.

After laminating the desired number of green sheets and sheet compositions including those provided with the penetrating holes in various orders, the laminated sheets were subjected to a cutting step in order to obtain a variety of raw laminated bodies each having 68 mm square of principal face, at the center of which a cavity is provided, followed by a pressing step.

The cross sectional configuration of each sample after the press step is shown in FIG. 5 to FIG. 16. The reference numerals 11, 12 and 13, being in common in FIG. 5 to FIG. 16, showing the raw first sheet layer containing the foregoing first: powder, the second sheet layer containing the second powder and the cavity the opening of which is positioned along the principal face, respectively.

Figure 5:
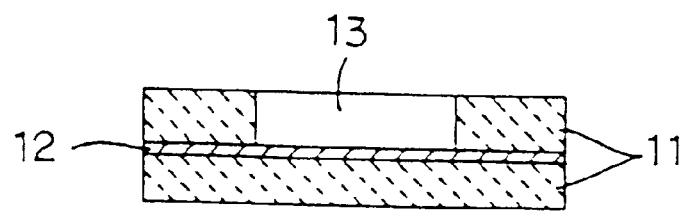
FIG. 5 denotes a cross section illustrating the raw laminated body in the sample 1 produced in the experimental example executed for evaluating the warp characteristics and the like with respect to the laminated body provided with a cavity according to the other preferred embodiment of the present invention.
Figure 8:
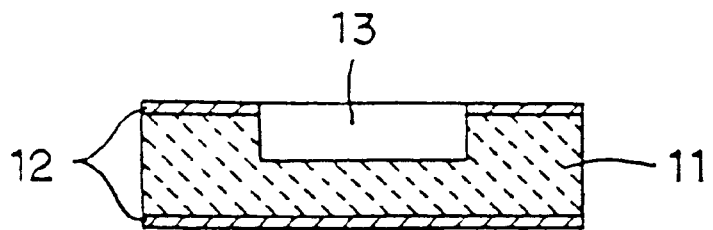
FIG. 8 denotes a cross section illustrating the raw laminated body in the sample 4 produced in the experimental example similar to the sample 1 shown in FIG. 5.
Figure 9:
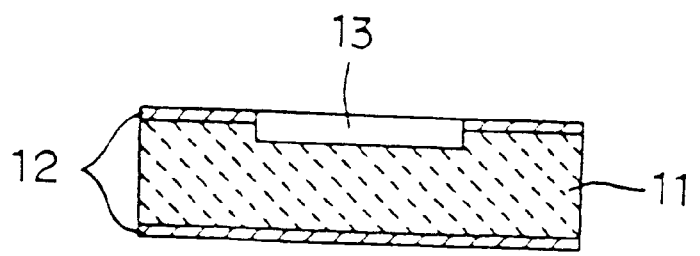
FIG. 9 denotes a cross section illustrating the raw laminated body in the sample 5 produced in the experimental example similar to the sample 1 shown in FIG. 5.
Figure 10:
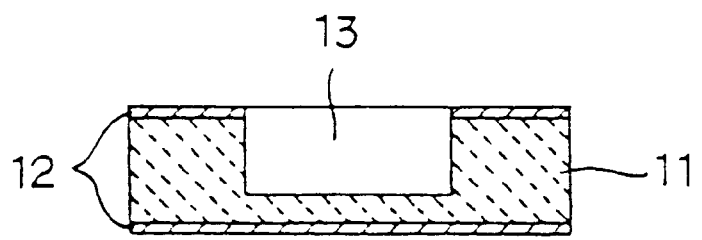
FIG. 10 denotes a cross section illustrating the raw laminated body in the sample 6 produced in the experimental example similar to the sample 1 shown in FIG. 5.
Figure 11:
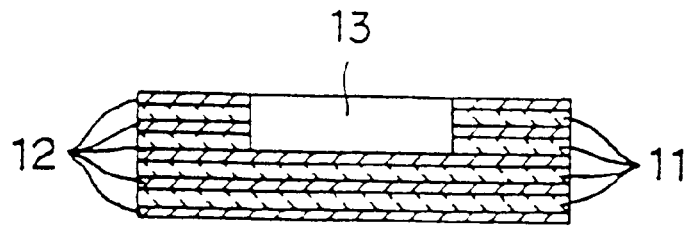
FIG. 11 denotes a cross section illustrating the raw laminated body in the sample 7 produced in the experimental example similar to the sample 1 shown in FIG. 5.
Figure 12:
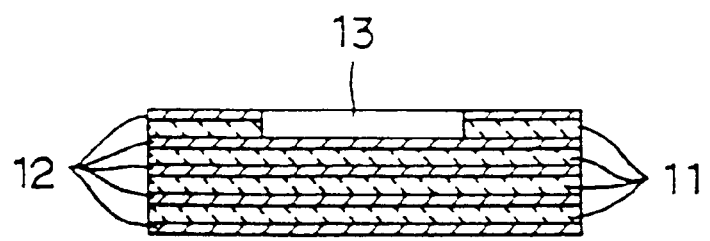
FIG. 12 denotes a cross section illustrating the raw laminated body in the sample 8 produced in the experimental example similar to the sample 1 shown in FIG. 5.
Figure 13:
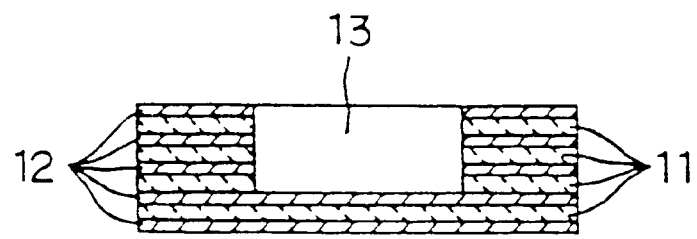
FIG. 13 denotes a cross section illustrating the raw laminated body in the sample 9 produced in the experimental example similar to the sample 1 shown in FIG. 5.
Figure 14:
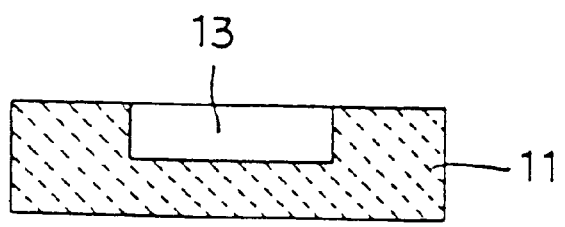
FIG. 14 denotes a cross section illustrating the raw laminated body in the sample 10 produced in the experimental example similar to the sample 1 shown in FIG. 5.
Figure 15:
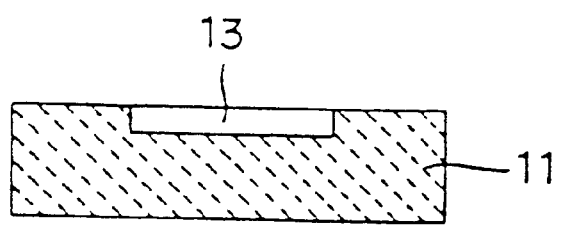
FIG. 15 denotes a cross section illustrating the raw laminated body in the sample 11 produced in the experimental example similar to the sample 1 shown in FIG. 5.
Figure 16:
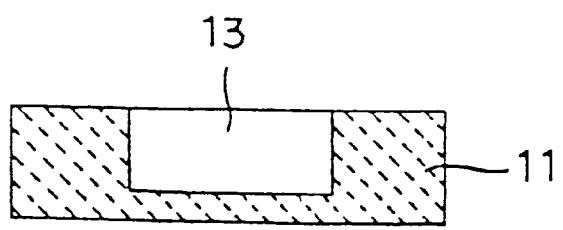
FIG. 16 denotes a cross section illustrating the raw laminated body in the sample 12 produced in the experimental example similar to the sample 1 shown in FIG. 5.

FIG. 5 to FIG. 7 show samples 1 to 3, respectively, wherein one second sheet layer 12 is formed. FIG. 8 to FIG. 10 show samples 4 to 6, respectively, wherein two second sheet layers 12 are formed. FIG. 11 to FIG. 13 show samples 7 to 9, respectively, wherein five second sheet layers 12 are formed. FIG. 14 to FIG. 16 show samples 10 to 12, respectively, wherein no second sheet layer 12 is provided.

While each sample 1 to 12 has an overall thickness of about 720 μm, the depth of the cavities 13 were determined to be 360 μm in the samples 1, 4, 7 and 10 shown in FIG. 5, FIG. 8, FIG. 11 and FIG. 14, respectively, 180 μm in the samples 2, 5, 8 and 11 shown in FIG. 6, FIG. 9, FIG. 12 and FIG. 15, respectively, and 540 μm in the samples 3, 6, 9 and 12 shown in FIG. 7, FIG. 10, FIG. 13 and FIG. 16, respectively.

Figure 17:
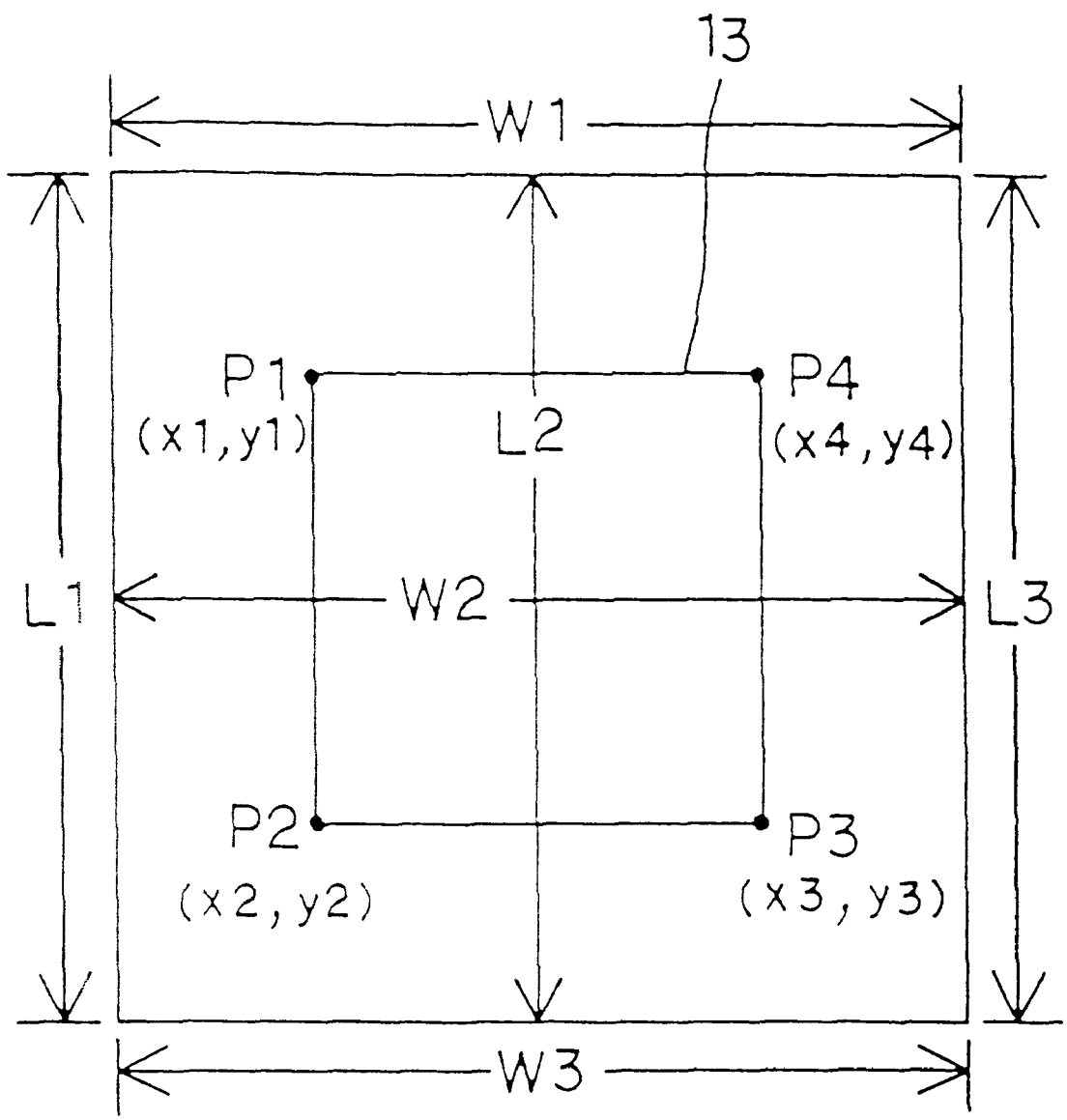
FIG. 17 is presented for describing the evaluation method of the laminated bodies with respect to the samples 1 to 12 shown in FIG. 5 to FIG. 16, respectively, denoting a plane view showing one of the principal faces of the laminated body on which the cavity is formed.

The raw laminated bodies corresponding to respective samples were then baked at 850° C. for 2 hours. Warp, contraction ratio, distribution of the overall dimension and distortion at the cavity portion were determined with respect to each laminated body after baking. FIG. 17 is presented for describing the evaluation methods of the laminated bodies in respective samples, which shows a plane view of the principal face on which the cavity 13 was formed.

Regarding the contraction ratio, the dimensions L1, L2, L3, W1, W2 and W3 shown in FIG. 17 were measured and the contraction ratio was calculated by the following formula using an averaged dimension obtained by averaging six dimensions of L1, L2, L3, W1, W2 and W3:

Contraction ratio=(mean dimension before baking—mean dimension after baking)/(mean dimension before baking)

The distribution of the overall dimension was calculated from the following formula:

Distribution=(triple value of the standard deviation of the dimensions of L1, L2, L3, W1, W2 and W3 after baking)/ (mean dimension after baking)

Regarding the distortion of the cavity portion, the coordinates of four apexes (x1, y1), (x2, y2) (x3, y3) and (x4, y4) were determined and the distortion was calculated by the following formula using a reference line connecting between the apex Pi and apex P2 with the apex P1 as a reference point, or by setting x1, x2 and x3 to zero:

$$\text{Distortion} = [(x3-x4)^2+(y3-y2)^2/2]^{1/2}/[(x3+x4+y2+y3)/4]$$

Warp, contraction ratio, distribution of the overall dimension and distortion at the cavity portion for each sample are listed in TABLE 1 below. General evaluations are shown in TABLE 1 by the symbols A (very good), B (good) and C (poor).

TABLE 1

| Sample | Cited FIG. | Warp (mm) | Contraction ratio (%) | Distribution of the overall dimension (%) | Distortion at the cavity portion (%) | Evaluation |
|---|---|---|---|---|---|---|
| 1 | FIG. 5 | 0 | 1.12 | 0.21 | 0.16 | A |
| 2 | FIG. 6 | 2 | 1.34 | 0.32 | 0.16 | B |
| 3 | FIG. 7 | 2 | 1.27 | 0.28 | 0.24 | B |
| 4 | FIG. 8 | 0 | 0.84 | 0.13 | 0.21 | A |
| 5 | FIG. 9 | 0 | 0.76 | 0.21 | 0.12 | A |
| 6 | FIG. 10 | 0 | 0.65 | 0.16 | 0.11 | A |
| 7 | FIG. 11 | 0 | 0.35 | 0.088 | 0.076 | A |
| 8 | FIG. 12 | 0 | 0.34 | 0.22 | 0.014 | A |
| 9 | FIG. 13 | 0 | 0.36 | 0.18 | 0.045 | A |
| 10 | FIG. 14 | 0 | 8.21 | 1.10 | 0.84 | C |
| 11 | FIG. 15 | 0 | 7.98 | 0.91 | 0.46 | C |
| 12 | FIG. 16 | 0 | 8.76 | 1.13 | 0.52 | C |

Referring to the Table, sample 1 and samples 4 to 9 among the samples 1 to 9 that fall within the range of the present invention especially show zero warp, a contraction ratio of as small as 0.34 to 1.12%, a distribution of overall dimension of as small as 0.088 to 0,22% and a distortion of the cavity portion of as small as 0.014 to 0.21%, which are generally evaluated to be very good.

Samples 2 and 3 among the samples 1 to 9 that fall within the range of the present invention show, on the contrary, have an undesirable warp of 2 mm. This is because, as will be easily comprehended from the comparison of FIG. 6 indicating the samples 2 and 3 with FIG. 5 indicating the sample 1, the second sheet layer 12 is biased against the lamination direction or, in other words, the thicknesses of respective first sheet layers 11 positioned at each side of the second sheet layer 12 are different with each other.

The results hitherto described show that, as shown by FIG. 5 to FIG. 7 and FIG. 11 to FIG. 13, it is preferable to adjust the thicknesses of respective first sheet layers 11 positioned at each side of the second sheet layer 12 to be substantially the same with each other when a plurality of the first sheet layers 11 are configured to have a structure to be laminated via the second sheet layer 12.

Since the samples 10, 11 and 12 that fall out of the range of the present invention are, as shown in FIG. 14 to FIG. 16, not provided with any second sheet layers, the samples have contraction ratios of as large as 8.21%, 7.98% and 8.76%, respectively, as well as a distribution of the overall dimensions of as large as 1.10%, 0.915 and 1.13%, respectively, and a distortion of the cavity portions of as large as 0.84%, 0.46% and 0.52%, respectively. Respective values of contraction ratios, distribution of the overall dimensions and distortion of the cavity portions are all larger compared with the corresponding values of the samples 1 to 9 that fall within the range of the present invention, especially as compared with the values of the samples 4 to 9. These results indicated that the samples 10 to 12 have poor characteristics as compared with samples 1 to 9, especially as compared with samples 4 to 9.

While the invention has been particularly shown and described with reference to preferred embodiments thereof, it will be understood by those skilled in the art that the forgoing and other changes in form and details may be made therein without departing from the spirit of the invention.

What is claimed is:

1. A laminated body comprising:
    a first sheet layer comprising a first powder, wherein at least a part of which first powder is a sintered state;
    a second sheet layer comprising a second powder in a non-sintered state and disposed so as to contact the first sheet layer and having a surface which is not porous;
    wherein a part of the first powder extends into the entire area of the second sheet layer such that the first powder and the second powder are solidified to each other;
    wherein at least a part of the first powder has a melting point lower than the sintering temperature of the second powder;
    wherein the second sheet layer is thinner than the first sheet layer; and
    wherein there is a conductive film on a surface or inside the laminated body, or both.

2. The laminated body according to claim 1, wherein the first powder comprises a glass.

3. The laminated body according to claim 2, wherein the glass comprises a nucleated glass.

4. The laminated body according to claim 3, wherein the first powder further comprises a ceramic.

5. The laminated body according to claim 4, wherein the first powder ceramic comprises alumina and the first powder glass is at least one material selected from the group consisting of anorthite nucleated glass, borosilicate glass and corgelite system nucleated glass.

6. The laminated body according to claim 5, wherein the second powder comprises a ceramic.

7. The laminated body according to claim 6, wherein a pair of the first sheet layers of substantially the same thickness are respectively positioned at each side of the second sheet layer.

8. The laminated body according to claim 1, wherein the first powder comprises a class and a ceramic and the second powder comprises a ceramic.

9. The laminated body according to claim 1, having at least one cavity with its opening positioned along at least one of the principal faces of the laminated body.

10. The laminated body according to claim 9, wherein a pair of the first sheet layers of substantially the same thickness are respectively positioned at each side of the second sheet layer.

11. The laminated body according to claim 10, wherein the first powder comprises a glass and a ceramic and the second powder comprises a ceramic.

12. The laminated body according to claim 1, having at least one cavity with its opening positioned along at least one of the principal faces of the laminated body.

13. A method for producing a laminated body comprising the steps of:
    providing a raw laminated body having a conductive film on a surface or inside the laminated body, or both, and comprising a first sheet layer comprising a first powder disposed in contact with a second sheet layer which comprises a second powder which does not sinter at a temperature capable of sintering at least a part of the first powder, wherein the second sheet layer is thinner than the first sheet layer, and wherein at least a part of the first powder has a melting point lower than the sintering temperature of the second powder; and
    baking the raw laminated body at a temperature at which at least a part of the first powder is sintered while the second powder is not sintered and at which a part of the first powder diffuses or flows into the entire area of the second sheet layer and establishes a surface of the second sheet layer which is not porous.

14. The method for producing the laminated body according to claim 13, wherein the raw laminate body is provided with a pair of the first sheet layers of substantially the same thickness respectively positioned at each side of the second sheet layer.

15. The method for producing the laminated body according to claim 13, wherein the raw laminate body first sheet layer is provided as at least one first green sheet comprising the first powder.

16. The method for producing the laminated body according to claim 15, wherein the raw laminate body second sheet layer is provided as at least one second green sheet comprising the second powder.

17. The method for producing a laminated body according to claim 13, including the step of forming a conductive film on the surface or inside of raw laminated body, or both.

18. The method for producing a laminated body according to claim 17, including the step of forming at least one cavity in the raw laminated body so that the cavity opening is along at least one of the principal faces of the raw laminated body, and wherein the first powder comprises a glass and a ceramic and the second powder comprises a ceramic.

19. The method for producing a laminated body according to claim 17, wherein the conductive film comprises a conductive metal powder that is sintered during baking.

20. The method for producing a laminated body according to claim 13, including the step of forming at least one cavity in the raw laminated body so that the cavity opening is along at least one of the principal faces of the raw laminated body.

21. The method for producing a laminated body according to claim 20, including the step of laminating a plurality of the green sheets to obtain the raw laminated body, and wherein the step of forming the cavity includes disposing a penetrating hole through a green sheet positioned at an exterior surface of the plurality of green sheets.

22. The method for producing a laminated body according to claim 21, wherein the step of disposing the penetrating hole is executed prior to the step of laminating a plurality of the green sheets to obtain the raw laminated body.

23. The method for producing a laminated body according to claim 21, including the step of laminating the green sheets to be disposed with the penetrating hole and disposing the penetrating hole through the resulting laminated body prior to forming said raw laminated body.

24. A laminated body comprising:
    a pair of first sheet layers each comprising a first powder, wherein at least a part of which first powder is a sintered state;
    a second sheet layer sandwiched between the pair of first sheet layer, the second sheet layer comprising a second powder in a non-sintered state and disposed so that surfaces thereof which are not porous contact the first sheet layers;
    wherein a part of each first powder is within the second sheet layer such that the first powder and the second powder are solidified to each other, and wherein one of the pair of first sheet layers has a cavity therein extending to and exposing a portion of the second sheet layer, the cavity having an opening positioned along at least one of the principal faces of the laminated body.

* * * * *